(12) United States Patent
Merrill et al.

(10) Patent No.: US 6,326,314 B1
(45) Date of Patent: *Dec. 4, 2001

(54) INTEGRATED INDUCTOR WITH FILLED ETCH

(75) Inventors: Richard Billings Merrill, Woodside; Tsung-Wen Lee, Milpitas, both of CA (US)

(73) Assignee: National Semiconductor Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/933,464

(22) Filed: Sep. 18, 1997

(51) Int. Cl.[7] .................................................. H01L 21/46
(52) U.S. Cl. .......................... 438/750; 438/700; 438/704; 438/733; 438/745; 438/756; 438/739; 438/753; 216/2
(58) Field of Search ................................. 216/2; 438/700, 438/704, 733, 734, 745, 739, 750, 753, 756, 778, 787

(56) References Cited

U.S. PATENT DOCUMENTS

| | | | |
|---|---|---|---|
| 4,472,239 | 9/1984 | Johnson et al. | 156/647 |
| 4,478,077 | 10/1984 | Bohrer et al. | 73/204 |
| 4,587,105 | 5/1986 | Bonne et al. | 422/98 |
| 4,682,503 | 7/1987 | Higashi et al. | 73/755 |
| 4,895,616 | * 1/1990 | Higashi . | |
| 5,370,766 | 12/1994 | Desaigoudar et al. | 156/643 |
| 5,416,356 | 5/1995 | Staudinger et al. | 257/531 |
| 5,446,311 | 8/1995 | Ewen et al. | 257/531 |
| 5,450,263 | 9/1995 | Desaigoudar et al. | 360/110 |
| 5,481,131 | 1/1996 | Staudinger et al. | 257/531 |
| 5,497,337 | 3/1996 | Ponnapalli et al. | 364/489 |
| 5,539,241 | 7/1996 | Abidi et al. | 257/531 |
| 5,600,174 | 2/1997 | Reay et al. | 257/467 |
| 6,012,469 | * 6/2000 | Li | 134/1.3 |

FOREIGN PATENT DOCUMENTS

| | | |
|---|---|---|
| 63140560 | 6/1988 | (JP) . |
| 02072660 | 3/1990 | (JP) . |
| 03178158 | 8/1991 | (JP) . |
| 03198373 | 8/1991 | (JP) . |
| 05335487 | 12/1993 | (JP) . |

OTHER PUBLICATIONS

J.Y.–C. Chang, et al., "Large Suspended Inductors on Silicon and Their Use in a 2 μm CMOS RF Amplifier", IEEE Electronics Device Letters, vol. 14, No. 5, May 1993, pp. 246–248.

R.B. Merrill, et al., "Optimization of High Q Integrated Inductors for Multi–Level Metal CMOS", IEDM 95–983, 1995, pp. 38.7.1–38.7.4.

Ahmadreza Rofougaran, et al., "A 1 GHz CMOS RF Front–End IC for a Direct–Cobversion Wireless Receiver", IEEE Journal of Solid State Circuits, vol. 31, No. 7, Jul. 1996, pp. 880–889.

* cited by examiner

Primary Examiner—Christopher Henderson
(74) Attorney, Agent, or Firm—Stallman & Pollock LLP

(57) ABSTRACT

The high Q inductor process for reducing substrate interaction of integrated inductors includes etching away some of the silicon substrate after the inductor has been formed on the substrate. A first etch process is performed to form an opening in the center of the inductor exposing the silicon substrate. A second etch process is performed to etch the exposed silicon substrate to form a trench in the silicon substrate. A third etch process is performed to etch the trench into an inverted pyramidal cavity within the substrate and extending beneath the inductor. The pyramidal cavity is then filled with a solution, such as spin-on-glass thereby providing mechanical support for the inductor.

18 Claims, 4 Drawing Sheets

INTEGRATED INDUCTOR WITH FILLED ETCH

BACKGROUND OF THE INVENTION

1. Technical Field of the Invention

The present invention relates to the field of integrated circuits (ICs) used in radio frequency (RF) and microwave circuits, and in particular, to the construction and integration of inductors within such ICs.

2. Description of the Related Art

Electrical systems are made up of various components, including active elements such as transistors, and passive elements such as inductors, capacitors, and resistors.

One common electrical system is a phase-locked loop (PLL). A PLL is a frequency-selective system that uses feedback to maintain an output signal in a specific phase relationship with a reference signal. Monolithic PLLs are used in many areas of electronics to control the frequency and/or phase of a signal. These applications include FM detectors, frequency synthesizers, and analog and digital modulators and demodulators. FIG. 1 shows the block diagram of a basic phase-locked loop system 100 which comprises a phase detector 101, a voltage-controlled oscillator (VCO) 103, and a loop filter 105. The PLL 100 operates such that the phase detector 101 compares two input frequencies, $f_{in}$ and $f_{vco}$, and generates an output that is proportional to their phase difference. If the two input frequencies are not equal, the VCO 103 generates an output signal which shifts in frequency in the direction of $f_{in}$. If the input frequencies are equal, then the VCO "locks" to the input frequency maintaining a fixed phase relationship with the input signal. The loop filter 105 controls the PLL dynamics and therefore the performance of the system.

A key component of the PLL is the voltage controlled oscillator (VCO) which tracks the incoming signal or extracts information from it. An important design aspect of the VCO is the noise content of the output signal. The dominant resultant noise will appear as phase noise (jitter) on the output signal from the VCO. Due to the dynamics of the PLL some of the sources of noise will be filtered by the loop functions that have either a low-pass characteristic or a high-pass characteristic. Typically it will be found that one particular noise source will be dominant and the PLL performance can then be adjusted to minimize the output noise.

A PLL is frequently used to enhance the noise performance of an oscillator by taking advantage of these noise-filtering properties. For example, a crystal oscillator typically has very good low frequency noise characteristics and integrated inductive-capacitive (LC) oscillators can substantially reduce phase jitter of a complementary metal oxide semiconductor (CMOS) IC VCO. Indeed this integrated LC oscillator is desirable because it operates at the limits of CMOS performance levels, and because feedback techniques typically are not fast enough.

The problem with the conventional integrated LC oscillators is that power levels are too high due to current shoot-through in the inductor which results from a very low inductance quality value, Q. Additionally, the temperature dependence of the oscillation frequency is too great for practical operation of the integrated LC oscillator in VCO designs.

These intrinsic problems stem from the interaction of the inductor with the substrate on the wafer. The substrate absorbs a significant amount of RF energy radiated from the inductor which reduces the inductance quality value, Q. Additionally, the self-resonance caused by the parasitic capacitance of the inductors to the substrate reduces the maximum effective operating frequency, Fmax. Each of these effects decreases the overall performance of an integrated LC oscillator.

These problems caused by the interaction with a substrate can be overcome by making the area under the inductor appear locally insulating. By etching out the substrate from under the inductor such that the inductor is encased in a suspended oxide layer attached to the rest of the silicon wafer, the interaction between the inductor and the substrate is minimized. This technique of suspending the inductor in the air over the etch pit, is further explained in Large Suspended Inductors on Silicon and Their Use in a 2-um CMOS RF Amplifier, IEEE Electron Device Letters, Vol. 14, No. 5, May 1993, pp.246–48, and A 1 GHz CMOS RF Front-End IC for a Direct-Conversion Wireless Receiver, IEEE Journal of Solid-State Circuits, Vol. 31, No. 7, July 1996, pp. 880–89, both of which are incorporated herein by reference.

Page 883 of the latter publication describes a method of eliminating the parasitic capacitance under a spiral inductor by selectively removing the underlying silicon substrate. This leaves the spiral encased in a layer of oxide suspended above an air-gap gap. Via holes which will expose the surface of the silicon after fabrication and passivation surround the spiral. A selective etchant removes the exposed silicon at a much higher rate than it does oxide and metal. After sufficient exposure to the etchant, a deep cavity forms under the inductor, while the remaining active area is left intact.

Such a suspended inductor technique does permit wholly-integrated RF components in CMOS circuits. Thus, the suspended inductor is useful in a local oscillator, a low-noise-amplifier, a power amplifier, and even a low quality bandpass filter. However, since the wafer on which the suspended inductor is fabricated is very fragile, it easily susceptible to breaking. Due to this susceptibility, the suspended inductor is not a robust architecture for the typical plastic package assembly process. The plastic package process typically involves injecting an epoxy compound under pressure into the cavity under the suspended inductor, as a result, if the inductors are not sufficiently supported they can be damaged during the package process. Thus, a need exists to achieve performance equivalent to that of a suspended inductor, while simultaneously achieving a more rugged structure.

SUMMARY OF INVENTION

An integrated inductor fabricated on a wafer and having a robust architecture and reduced substrate interaction is achieved by forming an inductor on the substrate. The inductor is then etched to form an opening in a portion of the inductor to expose the substrate. The exposed substrate is then etched to form an isolation pit beneath the inductor. The isolation pit will etch in an inverted pyramidal shape. Subsequently, the isolation pit is filled with a material, such as spin-on-glass. As a result, an inductor having a rugged architecture is therefore constructed.

These and other features and advantages of the present invention will be understood upon consideration of the following detailed description of the invention and the accompanying drawings.

BRIEF DESCRIPTION OF THE DRAWINGS

Like reference symbols are employed in the drawings and in the description of embodiments to represent the same or similar items.

DETAILED DESCRIPTION OF A PREFERRED EMBODIMENT

The fabrication process of a monolithic integrated circuit involves a sequence of processing steps. FIGS. 2A–2F show cross sectional views illustrating the process fabrication sequence of a toriodially-shaped integrated inductor fabricated in accordance with one embodiment of this invention. This embodiment provides an inductor suitable for controlling a VCO in a PLL.

Figure 1:
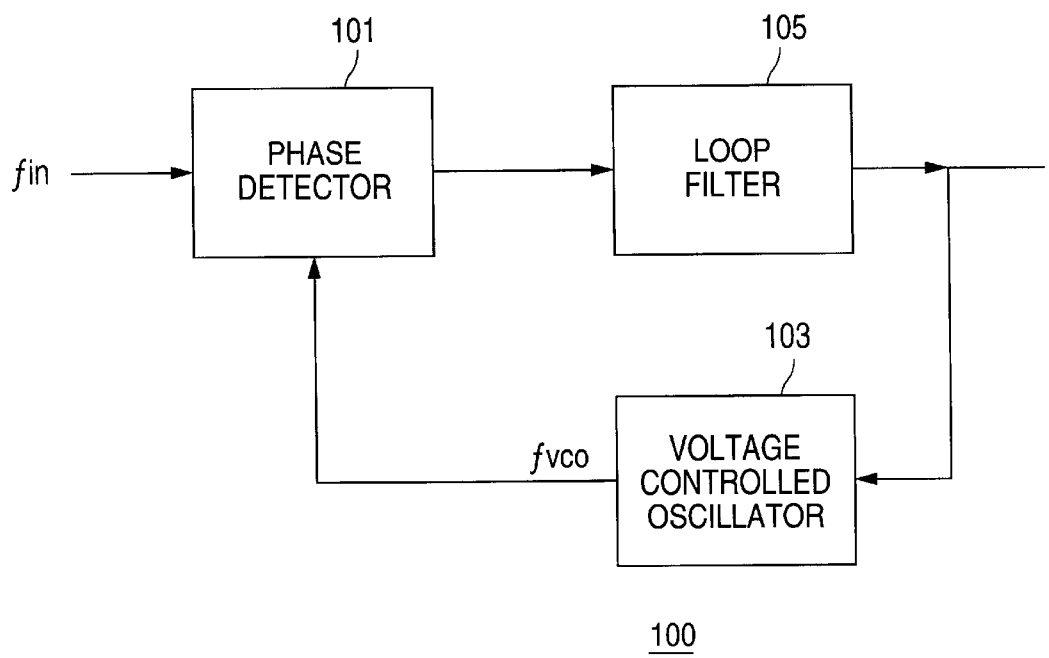
FIG. 1 shows a conventional phase-locked loop system.
Figure 2A:
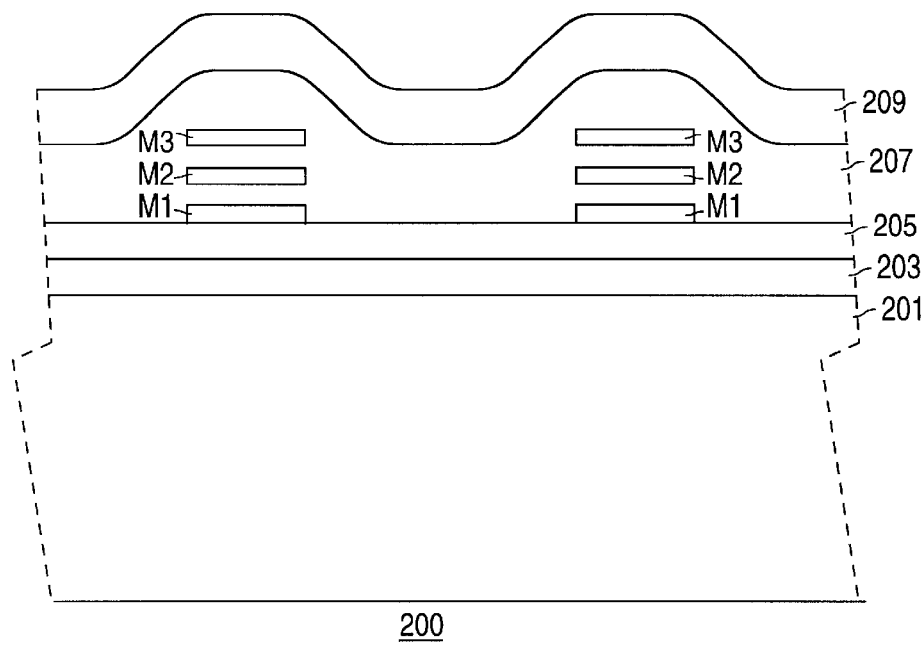
FIGS. 2A–2F illustrate the cross-sectional views of the fabrication steps of an inductor in accordance with one embodiment of the present invention.

Referring to FIG. 2A, a silicon wafer 200 is processed normally through passivation. This processing includes forming a layer of field oxide 203 on the surface of the silicon substrate 201. A layer of dielectric material 205, typically silicon dioxide $SiO_2$, is formed on the field oxide 203. An annular inductor 207 is then formed as a coil of metal M1, metal M2, and metal M3. Although a coil inductor 207 is shown, it will be appreciated that other types of inductors can be used.

Subsequently, a layer of silicon nitride 209 functioning as an oxide mask, is deposited over the silicon wafer structure as shown in FIG. 2A.

In this embodiment, substrate 201 is doped type-N silicon. Although type-N doping is used, it will be appreciated that when a semiconductor material is used as substrate 201, either P or N conductivity type is suitable, as well as any convenient doping level. Additionally, the substrate 201 is consistent with typical silicon semiconductor substrates, although other silicon crystal orientations are suitable for use as substrate 201.

Figure 2B:
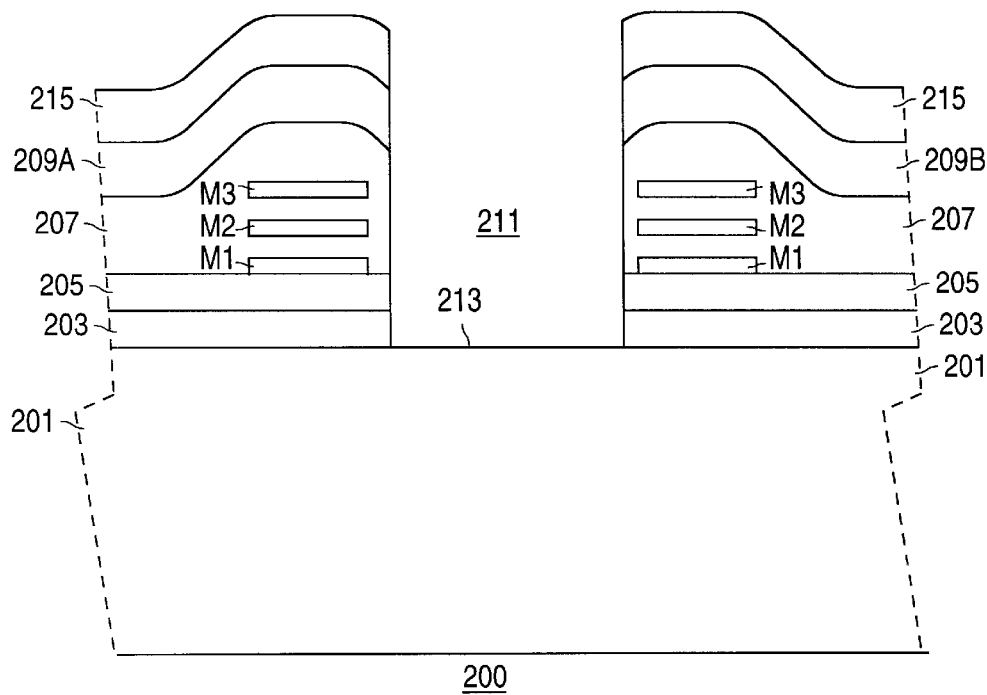

As shown in FIG. 2B, a masking technique is used to etch a selective opening 211 over the center of the inductor to expose the silicon substrate 213. An additional oxide mask 215, is deposited over the silicon nitride layer 209 and then an anisotropic silicon pad etch process is used to etch through the silicon nitride layer 209, the inductor 207, the dielectric layer 205 and the field oxide layer 203, to create the opening 211.

Figure 2C:
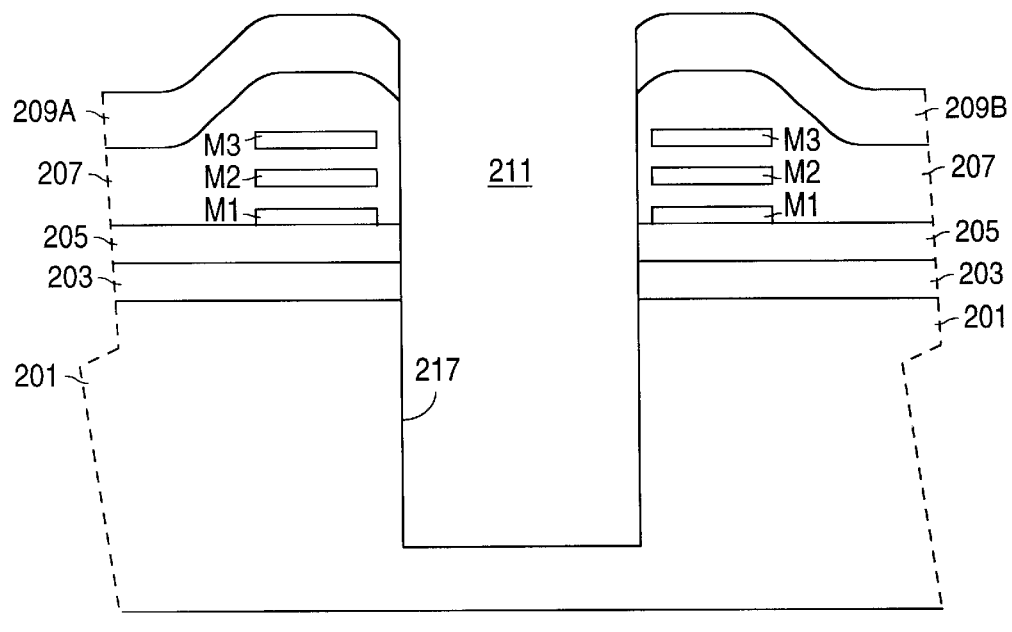

Then, using the two regions 209A, 209B of the silicon nitride formed on either side of the opening 211 as a mask, the exposed silicon surface 213 is then etched to form a trench 217 at the center of the inductor 207, as shown in FIG. 2C. A silicon trench etch process, such as a plasma etchant, can be used to create the trench 217. In one embodiment, the depth of the trench 217 is approximately equal to the diameter of the inductor 207.

Figure 2D:
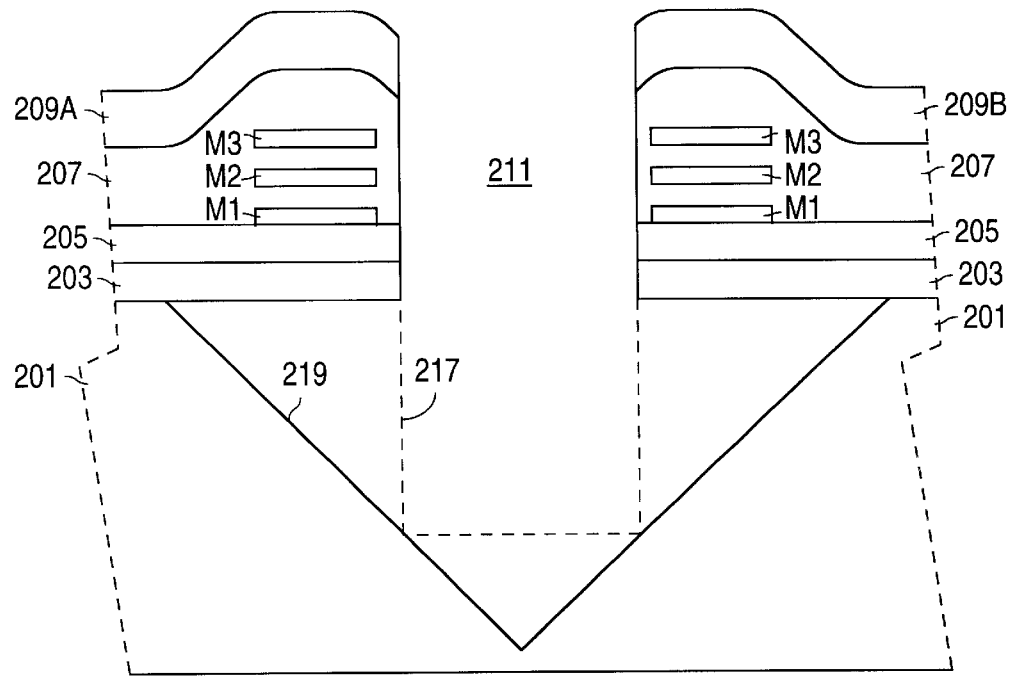

Referring to FIG. 2D, the substrate 201 is then etched again using a silicon etchant to form an isolation pit 219 on the wafer surface. In one embodiment the silicon wafer 200 is immersed in a wet silicon etch, such as potassium hydroxide (KOH). The KOH etchant used in this step etches away the substrate 201 anisotropically such that the etching results in the formation of an inverted pyramid-shaped isolation pit 219 on the wafer surface.

It is desirable to form the isolation pit 219 as a deep cavity to minimize radiative loss into the substrate 201, but consideration must also be taken of the effect the depth of the isolation pit 219 has on the strength of the wafer 200. Since in this embodiment the inductor 207 is a coil inductor rather than a flat inductor, less undercut of the inductor 207 is needed to obtain a given inductance value. Thus, in one embodiment, the depth of the isolation pit 219 is approximately 100 microns, representing only one-eighth of the thickness of an eight-inch diameter wafer.

Figure 2E:
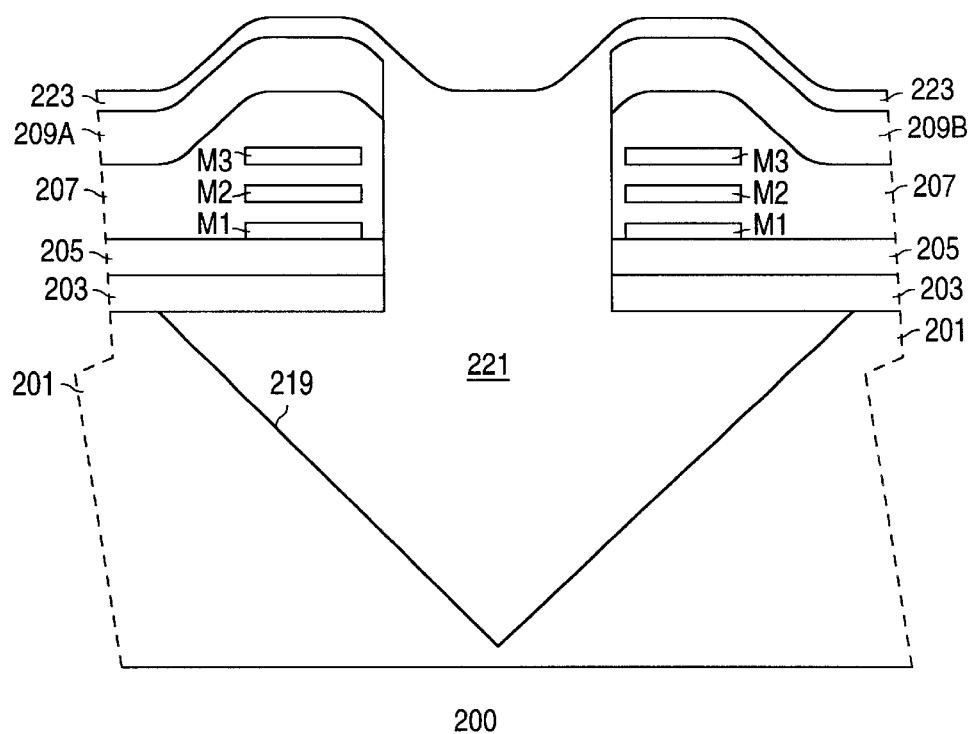

The isolation pit 219 formed beneath the inductor 207 is then filled with a solution, such as spin-on-glass (SOG) 221, to improve the mechanical strength of the structure, as shown in FIG. 2E. Spin-on-glass is a self-planarizing film that thins down over high points and fills deep pockets or height differential steps. It is applied as a liquid to the wafer 200 and spreads out over the surface of the wafer 200 as the wafer 200 is spun. As a result, this SOG solution 221 helps to protect the silicon wafer 200 from impurities from the molding compound, although typically this is not a significant issue since any transistors formed on the substrate 201 are typically located several microns from the edge of the isolation pit 219. The SOG 221 is particularly advantageous if the wafer 200 is to be assembled in epoxy. In an alternate embodiment, the isolation pit 219 is filled with a material having high permeability, such as a compound containing embedded ferromagnetic material to increase the inductance.

Figure 2F:
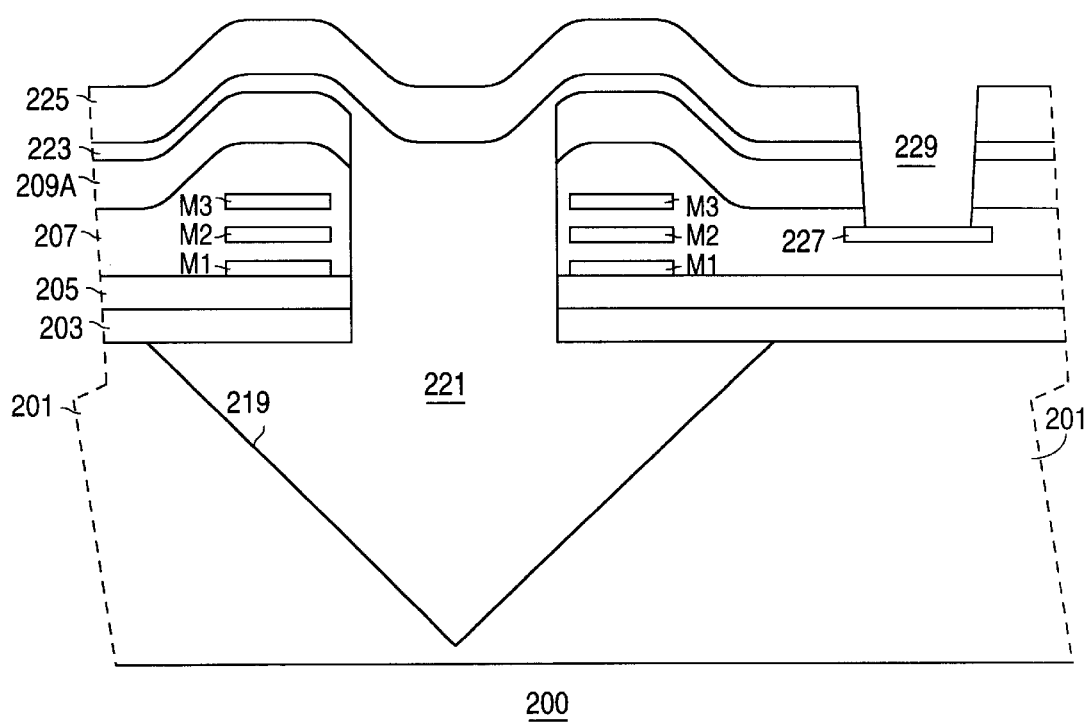

If necessary, a second passivation layer 223 can be deposited over the silicon nitride layers 209A, 209B and SOG 221, as shown in FIG. 2E, before the photoresist layer 225 is deposited, as shown in FIG. 2F. Depositing the second passivation layer 223, typically formed of silicon dioxide $SiO_2$, protects the nitride layers 209A, 209B from external contamination, provides a barrier to the diffusion of impurities into the silicon, and provides an insulation surface over which the photoresist layer 225 can be applied.

Referring again to FIG. 2F, the photoresist layer 225 is conventionally applied over the passivation layer 223 (or alternatively the silicon nitride layers 209A, 209B if passivation layer 223 is not applied) to define a pad mask over a conductive pad 227. The photoresist layer 225 and silicon nitride layer 209A, 209B are reactive-ion etched to remove the silicon nitride layer 209A, 209B from the pad mask area 229 thereby exposing the conductive pad 227 for making electrical connections for the semiconductor device.

The inductor fabrication technique in accordance with the present invention provides several advantages over the prior art. First, the mechanical strength of the integrated inductor 207 is increased. Since SOG 221 fills the isolation pit 219 the inductor 207 has a more robust architecture. Second, since the etch processes create a deep isolation pit 219 in the silicon substrate 201, substrate interaction is minimized. Finally, because the single isolation pit 219 is located at the center of the inductor 207, it is necessarily distant from other active structures formed on the substrate 201. Thus, this configuration provides increased reliability over the prior art configurations where pits are located around the outside of the inductor, closer to other active devices.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. A method of reducing interaction between a substrate and an integrated inductor formed on the substrate, the method comprising the steps of:

forming an integrated inductor on a substrate;

forming an opening in a portion of the integrated inductor to expose the substrate;

forming a cavity wherein the step of forming in an opening in a portion of the integrated inductor to expose the substrate comprises:

masking a region of the integrated inductor in a pattern to form an unmasked portion of the integrated inductor; and removing the unmasked portion of the integrated inductor to form an opening in the integrated inductor exposing the substrate in the exposed substrate; and disposing a mass of dielectric material within the substrate cavity.

2. A method of reducing interaction between a substrate and an integrated inductor formed on the substrate, the method comprising the steps of:

forming an integrated inductor on a substrate;

depositing an oxide-resistant layer on the integrated inductor;

etching an opening in a portion of the integrated inductor to expose the substrate;

etching the exposed substrate to form a cavity disposed therein;

etching the substrate cavity to extend the cavity beneath the integrated inductor; and disposing a mass of dielectric material within the extended substrate cavity.

3. The method of claim 2, wherein the step of etching an opening in a portion of the integrated inductor to expose the substrate comprises:

masking a region of the oxide-resistant layer in a pattern to form an unmasked portion of the oxide-resistant layer; and removing the unmasked portion of the oxide-resistant layer to form an opening in the integrated inductor exposing the substrate.

4. The method of claim 2, wherein the step of etching a substrate cavity in the exposed substrate comprises etching the exposed substrate with a plasma silicon etch process to form the substrate cavity.

5. The method of claim 2, wherein the step of etching the substrate cavity to extend the substrate cavity beneath the integrated inductor comprises anisotropically etching the substrate cavity with a wet silicon etch to extend the substrate cavity beneath the integrated inductor.

6. The method of claim 4, wherein the step of etching the exposed substrate with a plasma silicon etch process to form the substrate cavity comprises etching the exposed substrate to a depth of approximately one-hundred microns.

7. The method of claim 5, wherein the step of anisotropically etching the substrate cavity with a wet silicon etch to extend the substrate cavity beneath the integrated inductor comprises etching the substrate cavity with potassium hydroxide to extend the substrate cavity.

8. The method of claim 5, wherein the step of anisotropically etching the substrate cavity with a wet silicon etch to extend the substrate cavity beneath the integrated inductor comprises anisotropically etching the substrate cavity with a wet silicon etch to form an extended substrate cavity approximately pyramidal in shape.

9. A method of reducing interaction between a substrate and an integrated inductor formed on the substrate, the method comprising the steps of:

forming an integrated inductor on a substrate;

etching an opening in a portion of the integrated inductor to expose the substrate;

etching the exposed substrate to form a first cavity disposed therein;

etching the first substrate cavity to form a second substrate cavity, the second substrate cavity extending beneath the integrated inductor; and disposing a mass of spin-on-glass material within the substrate cavity.

10. A method of reducing interaction between a substrate and an integrated inductor formed on the substrate, the method comprising the steps of:

forming an integrated inductor on a substrate;

forming an opening in an upper portion of the integrated inductor to expose the substrate;

forming a cavity in the exposed substrate; and disposing a mass of dielectric material within the substrate cavity.

11. A method of reducing interaction between a substrate and an integrated inductor formed on the substrate, the method comprising the steps of:

forming an integrated inductor on a substrate;

forming an opening in a portion of the integrated inductor to expose the substrate;

forming a cavity in the exposed substrate; and disposing a mass of dielectric material within the substrate cavity wherein the step of forming an opening in a portion of the integrated inductor to expose the substrate comprises forming an opening in a center portion of the integrated inductor to expose the substrate.

12. A method of reducing interaction between a substrate and an integrated inductor formed on the substrate, the method comprising the steps of:

forming an integrated inductor on a substrate;

forming an opening in a portion of the integrated inductor to expose the substrate;

forming a cavity in the exposed substrate; and disposing a mass of dielectric material within the substrate cavity, wherein the step of forming a cavity in the exposed substrate comprises:

etching the exposed substrate to form a first substrate cavity; and etching the first cavity to form a second substrate cavity.

13. A method of reducing interaction between a substrate and an integrated inductor formed on the substrate, the method comprising the steps of:

forming an integrated inductor on a substrate;

forming an opening in a portion of the integrated inductor to expose the substrate;

forming a cavity in the exposed substrate; and disposing a mass of dielectric material within the substrate cavity, wherein the step of forming a cavity in the exposed substrate comprises:

etching the exposed substrate with a plasma silicon etch process to form a first substrate cavity; and anisotropically etching the first cavity with a wet silicon etch to form a second substrate cavity.

14. The method of claim 13, wherein the step of etching the exposed substrate with a plasma silicon etch process to form a first substrate cavity comprises etching the exposed substrate to a depth of approximately one-hundred microns.

15. The method of claim 13, wherein the step of anisotropically etching the first cavity with a wet silicon etch to form a second substrate cavity comprises etching the first cavity with potassium hydroxide to form the second cavity.

16. The method of claim 14, wherein the step of anisotropically etching the first cavity with a wet silicon etch to form a second substrate cavity comprises anisotropically etching the first cavity with a wet silicon etch to form a second substrate cavity approximately pyramidal in shape.

17. The method of claim 10, wherein the step of disposing a mass of dielectric material within the substrate cavity comprises disposing spin-on-glass (SOG) within the substrate cavity.

18. The method of claim 10, further comprising the step of applying a passivation layer over the integrated inductor and the dielectric material disposed in the substrate cavity.

* * * * *